United States Patent
Lo et al.

(10) Patent No.: US 8,395,381 B2
(45) Date of Patent: Mar. 12, 2013

(54) MICROMACHINED MAGNETIC FIELD SENSORS

(75) Inventors: Chiung C. Lo, Campbell, CA (US); Joseph Seeger, Menlo Park, CA (US); Martin Lim, San Mateo, CA (US)

(73) Assignee: Invensense, Inc., Sunnyvale, CA (US)

( * ) Notice: Subject to any disclaimer, the term of this patent is extended or adjusted under 35 U.S.C. 154(b) by 248 days.

(21) Appl. No.: 12/833,390

(22) Filed: Jul. 9, 2010

(65) Prior Publication Data

US 2012/0007598 A1  Jan. 12, 2012

(51) Int. Cl.
*G01R 33/02* (2006.01)
*G01R 33/09* (2006.01)
*G01R 33/07* (2006.01)

(52) U.S. Cl. .......... 324/249; 324/251; 324/252

(58) Field of Classification Search .......... 324/249, 324/251–252
See application file for complete search history.

(56) References Cited

U.S. PATENT DOCUMENTS

| | | | |
|---|---|---|---|
| 6,892,575 B2 | 5/2005 | Nasiri et al. | |
| 7,104,129 B2 | 9/2006 | Nasiri et al. | |
| 7,126,330 B2 | 10/2006 | Peczalski et al. | |
| 7,358,722 B2 | 4/2008 | Peczalski et al. | |
| 2007/0035294 A1* | 2/2007 | Peczalski et al. ............. | 324/252 |
| 2009/0015251 A1* | 1/2009 | Azumi et al. ................. | 324/247 |
| 2009/0027048 A1* | 1/2009 | Sato et al. ...................... | 324/247 |
| 2009/0072815 A1* | 3/2009 | Kahlman et al. ............. | 324/202 |
| 2009/0237074 A1* | 9/2009 | Kou et al. ...................... | 324/247 |

FOREIGN PATENT DOCUMENTS

WO    0002266    1/2000

* cited by examiner

*Primary Examiner* — Bot Ledynh
(74) *Attorney, Agent, or Firm* — Sawyer Law Group, P.C.

(57) ABSTRACT

A micromachined magnetic field sensor integrated with electronics is disclosed. The magnetic field sensors utilize Hall-effect sensing mechanisms to achieve 3-axis sensing. A Z axis sensor can be fabricated either on a device layer or on a conventional IC substrate with the design of conventional horizontal Hall plates. An X and Y axis sensor are constructed on the device layer. In some embodiments, a magnetic flux concentrator is applied to enhance the performance of the magnetic field sensor. In some embodiments, the magnetic field sensors are placed on slope sidewalls to achieve 3-axis magnetic sensing system. In some embodiments, a stress isolation structure is incorporated to lower the sensor offset. The conventional IC substrate and device layer are connected electrically to form a 3-axis magnetic sensing system. The magnetic field sensor can also be integrated with motion sensors that are constructed in the similar technology.

15 Claims, 16 Drawing Sheets

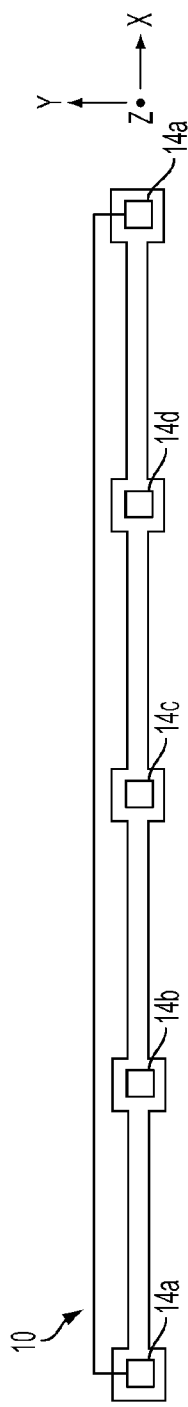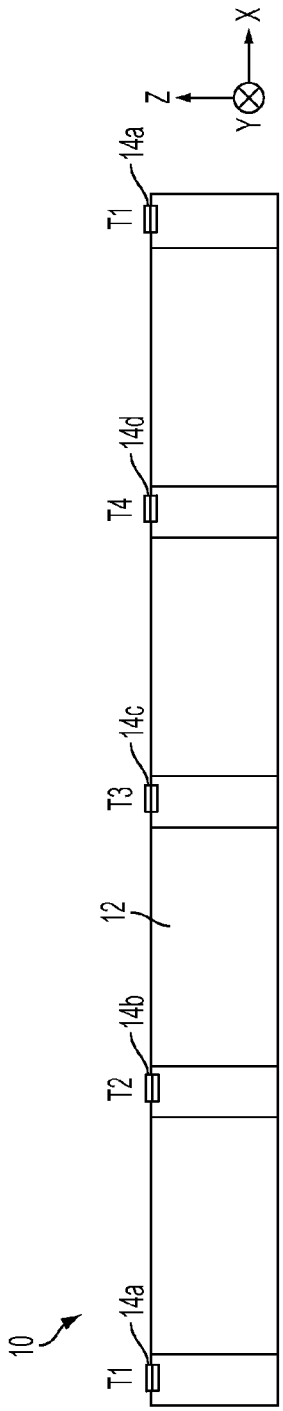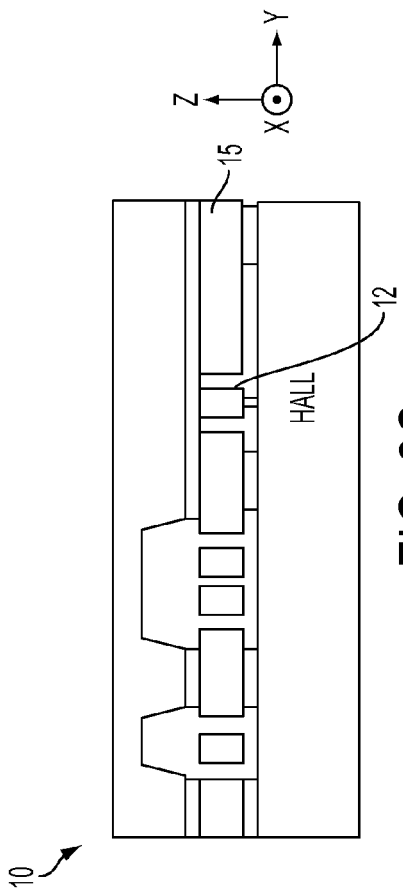

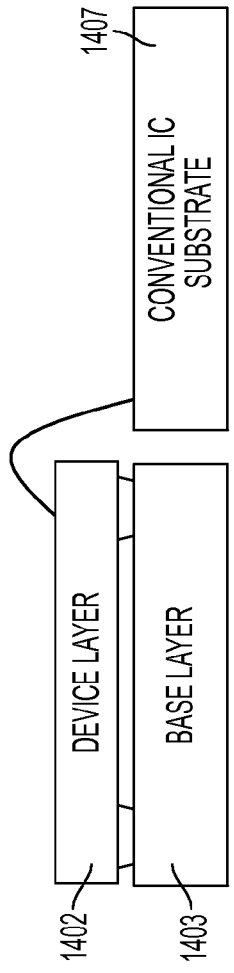
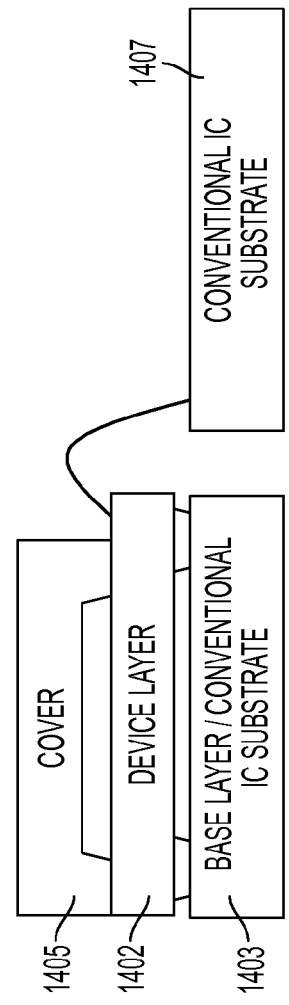
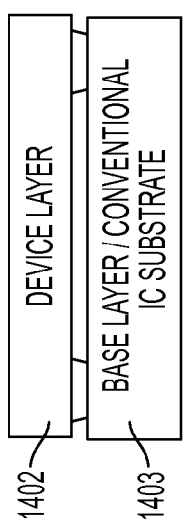
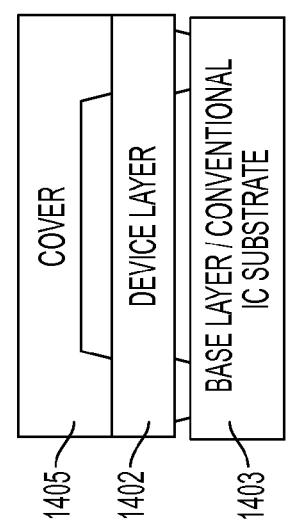
FIG. 15A
FIG. 15B
FIG. 15C
FIG. 15D

MICROMACHINED MAGNETIC FIELD SENSORS

CROSS-REFERENCE TO RELATED APPLICATIONS

The present application is related to co-pending U.S. Patent Application, entitled "Micromachined Offset Reduction Structures for Magnetic Field Sensing" Ser. No. 12/833,622, filed on Jul. 9, 2010, and assigned to the assignee of the present invention.

FIELD OF THE INVENTION

The present invention relates generally to sensing devices and more specifically to magnetic field sensors.

BACKGROUND OF THE INVENTION

Magnetic field sensors are widely deployed in consumer and industrial instruments for applications varying from position sensing, current sensing, data storage, and magnetic compassing. There are many methods to sense magnetic fields including Hall-effect, magneto-diode, magneto-transistor, magnetoresistive-effect, magnetic tunnel junction, magneto-optical, fluxgate, search coil, and Lorentz force-effect.

The Hall effect sensor fabricated by means of CMOS technology is preferred due to its low-cost batch fabrication with CMOS technology. However, a CMOS Hall sensor features mediocre performance with marginal sensitivity for electronic compass application are often corrupted by sensor offset which is about 1000× larger than the signal generated from the earth magnetic field. The offset is resulted from fabrication gradients of the magnetic sensor doping, misalignment of fabrication process, and mechanical stress through the piezoelectric effect. In addition, the thin-film process of CMOS technology is ideal to sense the magnetic field perpendicular to the chip surface (said Z-axis) and it's challenging to construct on-chip 3-axis Hall sensor required by low-cost electronic compass applications.

Currently, two solutions to address this issue are System-in-Packaging with three single-axis Hall sensors and Hall sensors with integrated magnetic concentrator (IMC). Electronics compass constructed by either System-in-Packaging with multiple sensors and Hall sensors with IMC has large azimuth error due to sensitivity mismatch, non-orthogonality between axes, and misalignment between sensors and IMC. In general, 1% of sensitivity mismatch causes an azimuth error of 0.3 degree. The mismatch could be worse at different operation temperatures. The non-orthogonality between axes is another source of inaccuracy. For two degrees of the non-orthogonality, the maximum azimuth error is approximately two degrees. The sensitivity mismatch problem is commonly addressed by costly compensation techniques with temperature reading from an on-chip temperature sensor and the non-orthogonality is addressed by either trimming or compensation. In addition, the drawbacks for current technologies include bulky and costly for the System-in-Packaging solution and large offset and hysteresis due to the existence of magnetic material for the Hall sensors with IMC solution.

CMOS Hall sensors are constructed with an N-well layer utilizing its high mobility and are preferred for measuring out-of plane (or Z-axis) magnetic fields because of its shallow structures. The shallow structures lead to high sensitivity and easy to implement symmetric input/output terminals resulting in a high resolution, shown in FIG. 1.

A Z-axis Hall sensor comprises a Hall plate $1(a)$-$1(d)$, a protection layer (2) above the Hall plate, a substrate (3) beneath the Hall plate, and five or more terminals for electrical connections $4(a)$-$4(n)$. Two of the four terminals, $4(a)$-$4(c)$, are source terminals connected to electrical ground and an electrical supply such as voltage source or current source, respectively. The remaining two terminals $4(b)$-$4(d)$ are sensing terminals which are connected to voltage sensing circuitry.

The additional terminals, $T_{sub}$, $4(e)$-$4(h)$ are designed to provide electrical isolation between the Hall plate and CMOS substrate. The output of voltage sensing circuitry is proportional to the difference of the voltages of the sensing terminals $4(b)$-$4(d)$ and is a function of the Z-axis magnetic flux density. More than one Hall plate could be used per axis to enable more balanced bridge measurements to reduce the offset. Furthermore, dynamic offset cancellation techniques such as a spinning current method could be adapted to lower the offset further.

SUMMARY OF THE INVENTION

A micromachined magnetic field sensor integrated with electronics is disclosed. The magnetic field sensors utilize Hall-effect sensing mechanisms to achieve 3-axis sensing by placing Hall sensing elements on the slope sidewall and to increase sensor sensitivity by integrating high mobility layer. A stress isolation structure is proposed to reduce sensor offset. A Z-axis sensor can be fabricated either on a device layer or on a conventional IC substrate with the design of conventional horizontal Hall plates. An X and Y axis sensor are constructed on the device layer. In some embodiments, a magnetic flux concentrator is applied to enhance the performance of the magnetic field sensor. A conventional IC substrate and device layer can then be connected electrically to form a 3-axis magnetic sensing system. The magnetic field sensor can also be integrated with motion sensors that are constructed in the similar technology.

BRIEF DESCRIPTION OF THE DRAWINGS

FIG. 2A-2C shows a first embodiment of the in-plane magnetic field sensor.

FIGS. 15A-15D illustrates a side-view of a device structure with potential integration with IC and other sensors in the process platform.

DETAILED DESCRIPTION

Figure 1:
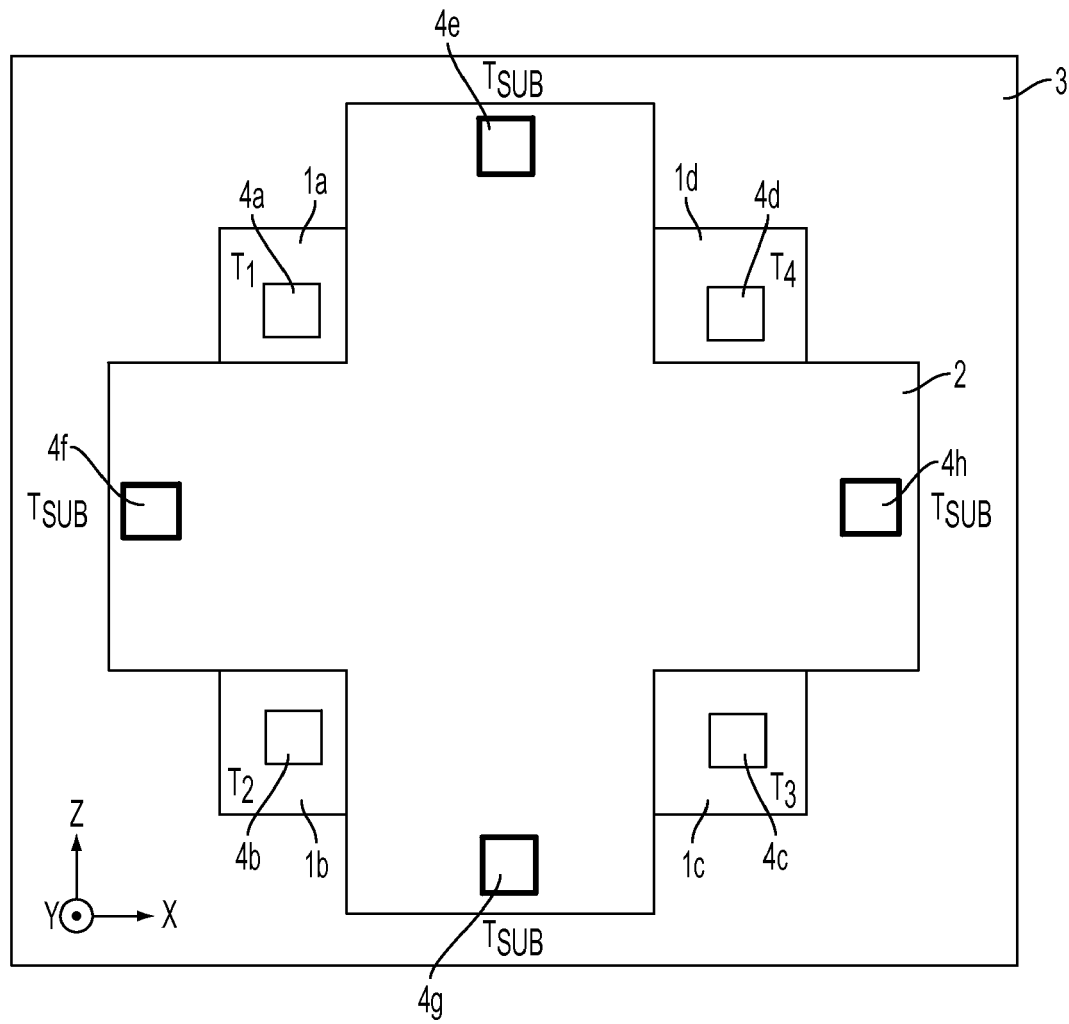
FIG. 1 show a conventional Z-axis magnetic field sensor.

The present invention relates generally to sensing devices and more specifically to magnetic field sensors. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention addresses the need of establishing 3-axis sensing by placing sensing elements on the slope sidewall and increasing sensor sensitivity by integrating high mobility layer. By harnessing the crystal structure, the azimuth error is reduced because sensing angles of sensors on the slope sidewalls are well controlled compared to a large mismatch from System-in-Packaging solution and in the integration of Hall sensor with IMC. In addition, the present invention also addresses the need of reducing sensor offset by lowering the mechanical stress with stress isolation structures.

In order to achieve 3-axis magnetic field sensing, in-planee magnetic field sensors are proposed to detect the in-planee field (or X and Y axis). To provide integration with signal processing circuitry, vertical Hall sensors are preferred to be constructed by the CMOS process, which limits the geometry of the structure and materials to use. Because of shallow device layers and asymmetric vertical structures, vertical sensors implemented in CMOS process with no post-processing achieve higher offset than the out-of-plane counterparts.

Recent advances in the magnetic sensing technology enable fabrication of Hall sensors with integrated magnetic concentrators (IMC) in volume production. The sensor consists of a CMOS integrated circuit, and a thin IMC disk direct bonded onto the CMOS surface. The IMC sensor measures the in-planee and the out-of-plane magnetic field. The latest application of these integrated micromachined magnetic field sensors was in wireless phones for compass applications (AKM's AK8973).

Low cost, miniature, and 3-axis magnetic field sensors with earth magnetic field sensing capability are in demand for emerging consumer applications in game interfaces, active image stabilization for cameras and video recorders, computer input devices, remote controls and biomedical activity monitoring. The low cost requirement requires the integration of a 3-axis magnetic field sensor, electronics and motion sensing units on the same die.

Although a system and method in accordance with the present invention can be utilized with a variety of sensors, much of the following discussion will describe embodiments utilizing Hall sensors. One of ordinary skill in the art readily recognizes that other magnetic sensing elements, such as any of a Lorentz effect magnetic sensor; a magnetoresistive sensor; a magneto-diode sensor; a magneto-transistor; a fluxgate; a magneto-impedance sensor; a magneto-optical sensor; and MAGFET or the like and their use can be utilized and that would be within the spirit and scope of the present invention.

High carrier mobility is an important characteristic for a sensor in accordance with the present invention. There are several high mobility materials that could be utilized within a Hall sensor. The signal-to-noise ratio of the magnetic sensor is proportional to the mobility of the Hall plate, and semiconductor materials have higher mobility than metals. This results in most Hall sensors being built with semiconductor materials.

In a standard CMOS process, two types of semiconductor silicon layers are obtained: P-type and N-type. Deposited in post-CMOS process step or in a separate substrate, materials with higher mobility than doped silicon such as Germanium (Ge), Gallium arsenide (GaAs), Indium arsenide (InAs), and Indium antimonide (InSb) could also be utilized in a system and method in accordance with the present invention.

FIG. 2A shows a first embodiment 10 of the in-plane magnetic field sensor. The magnetic field sensor is composed of a Hall plate 12 and four electrical terminals 14(a)-14(d). The Hall plate 12 is as narrow as a few microns in Y direction and as deep as the thickness of the device layer in Z direction. The plate is fabricated on a low doped single crystal device layer 15 and patterned by deep reactive ion etching (DRIE) to form an isolation trench. With the isolation trench as deep as the thickness of the device layer, the Hall plate 10 can be as thin as 1-2 microns to obtain up to about 4 times higher sensitivity, and the Hall plate 12 is isolated from the substrate without refill to lower undesired coupling.

In an embodiment, the device layer includes N-type doping for its high mobility. The electrical terminals 14(a) and 14(d) are connected to the corresponding pads on the IC substrate through bonding agents. Similar to a Z axis magnetic field sensor, two of the four terminals, T1 14(a) and T4 14(c), are the source terminals connected to electrical ground and an electrical supply such as a voltage source or current source, respectively. The remaining two terminals 14(b) and 14(d) are the sensing terminals which are connected to a voltage sensing circuitry. The output of the voltage sensing circuitry is proportional to the difference of the voltages of the sensing terminals, which are a function of the Y-axis magnetic flux density.

By increasing the depth of the Hall plate 12 in the Z direction while keeping the width in the Y direction and the length in the X direction the same, one can reduce the offset of the Hall plate 12 and thus the minimum detectable magnetic flux density, because the minimum detectable magnetic flux density is commonly limited by the drift of offset. More than one Hall plate can be coupled together per axis to enable a more balanced bridge measurement to reduce the offset. Furthermore, dynamic offset cancellation techniques, such as the spinning current method, could be adapted to lower the offset further. The side-view of a device structure with potential integration with other sensors in the process platform is illustrated in FIG. 2C.

Figure 3A:
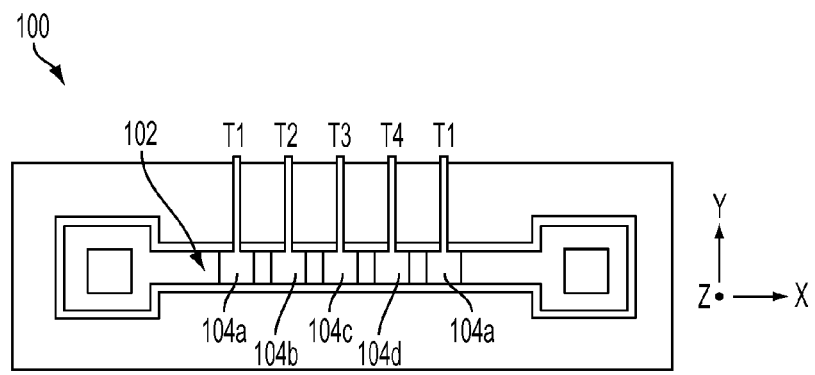
FIG. 3A-3C shows a second embodiment of an X or Y axis magnetic field sensor.
Figure 3B:
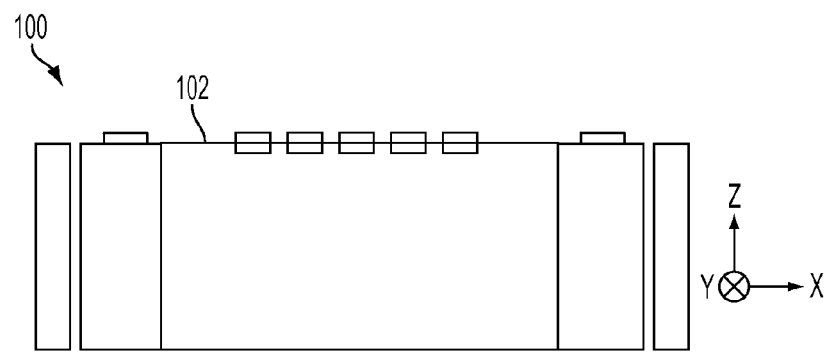
Figure 3C:
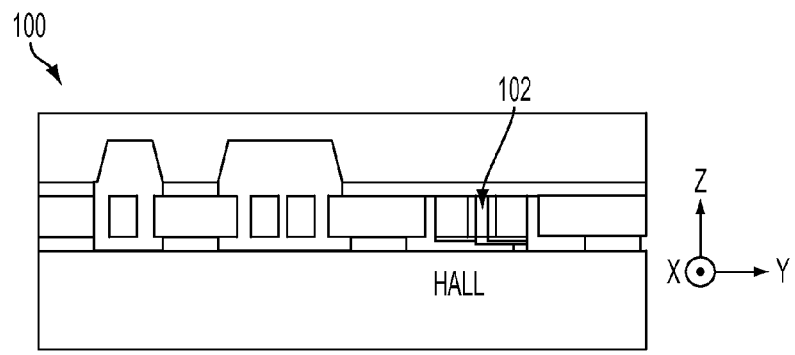

The second embodiment of an X axis or Y axis magnetic field sensor 100 is shown in FIG. 3A-3C. The side-view of a device structure with potential integration with other sensors in the process platform is illustrated in FIG. 3C. The structure has a Hall plate 102 with at least four terminals 104(a)-104(d). The Hall plate 102 is as narrow as a few microns in the Y direction and as deep as the thickness of the device layer in the Z direction. The plate is fabricated on a low-doped single crystal device layer and patterned by DRIE process to form an isolation trench. The device layer is preferred to have N-type doping for its high mobility.

The electrical terminals 104(a)-104(d) are connected through conductive wiring bridges in the Y direction across the isolation trench, and further connected to the corresponding pads on a conventional IC substrate. To establish the conductive wiring bridges across the isolation trench, a sacrificial layer is deposited followed by the deposition of the conductive wiring bridges. The sacrificial layer is removed completely or partially after forming the conductive wiring bridges.

The removal of the sacrificial layer reduces the 1/f noise due to lower interface charge traps which differentiates the technology. By providing the electrical connections in Y direction, the width of the Hall plate 102 can be reduced about 4 times, which leads to 4 times higher in sensitivity. The side-view of a device structure with potential integration with other sensors in the process platform is illustrated in FIG. 3C.

Figure 4A:
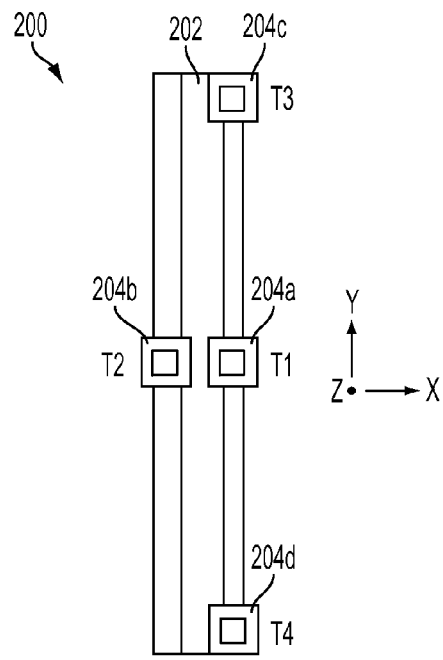
FIG. 4A-4C shows a third embodiment of an X or Y axis magnetic field sensor.
Figure 4B:
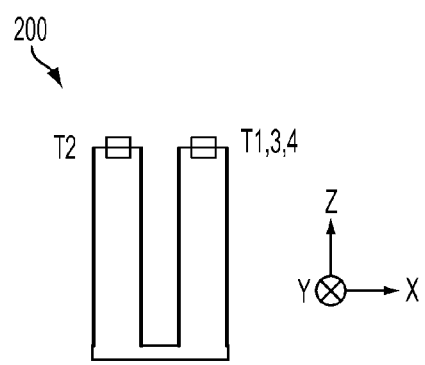
Figure 4C:
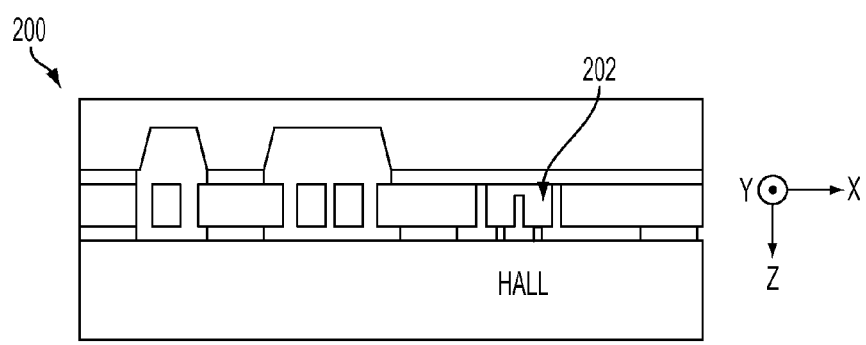

A third embodiment of an X axis or Y axis magnetic field sensor 200 is shown in FIG. 4A-4C. The structure has a Hall plate 202 with at least four terminals 204(a)-204(d). The plate is fabricated on a low doped single crystal device layer and patterned by DRIE process to form an isolation trench. The device layer is preferred to have N-type doping for its high mobility.

T1 204(a) and T2 204(b) are the source terminals connected to electrical ground and electrical supply such as voltage source or current source, respectively. The remaining two terminals T3 204(c) and T4 204(d) are the sensing terminals which are connected to voltage sensing circuitry. By supplying the current flowing in Z direction, a Hall voltage between T3 and T4 is generated, which is a function of the magnetic field, and it is sensed by the voltage sensing circuitry. The side-view of a device structure with potential integration with other sensors in the process platform is illustrated in FIG. 4C.

Figure 5A:
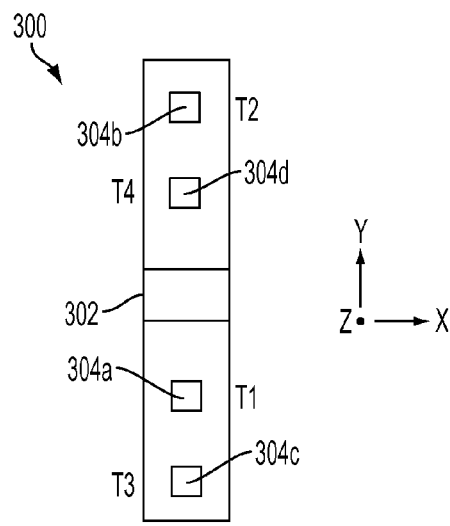
FIG. 5A-5C shows a fourth embodiment of an X or Y axis magnetic field sensor.
Figure 5B:
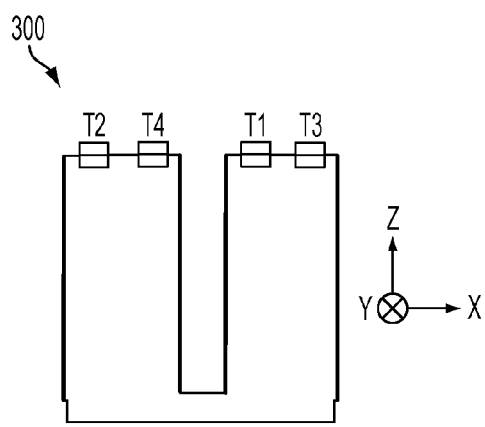
Figure 5C:
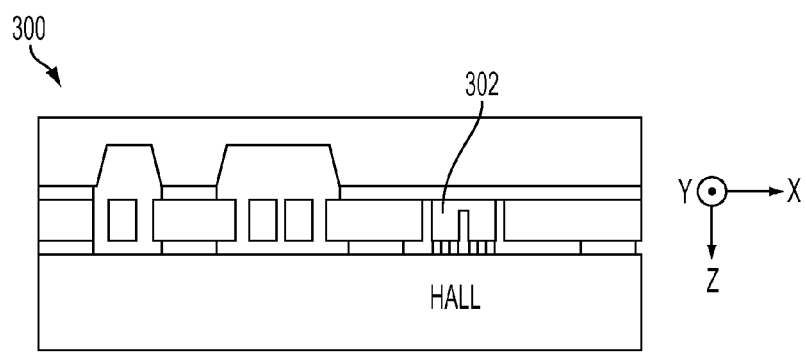

A fourth embodiment of an X or Y axis magnetic field sensor 300 is shown in FIG. 5A-5C. The structure and manufacturing process is similar to the third embodiment 200 shown in FIG. 4A-4C, except the orientation of the Hall plate 302. T1 304(c) and T2 304(b) are the source terminals connected to electrical ground and electrical supply such as voltage source or current source, respectively. The remaining two terminals T3 304(c) and T4 304(d) are the sensing terminals which are connected to voltage sensing circuitry. The Hall plate 302 is orientated in XZ plane with current flowing in Z direction. Upon applying a magnetic field in Y-direction, a Hall voltage between T3 304(c) and T4 304(d) is generated, is a function of the magnetic field, and is sensed by the voltage sensing circuitry. The side-view of a device structure with potential integration with other sensors in the process platform is illustrated in FIG. 5C.

Figure 6A:
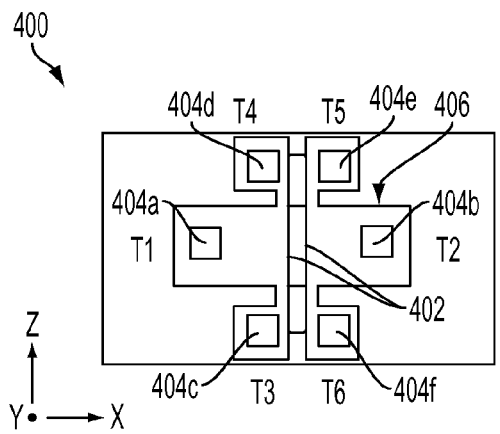
FIG. 6A-6C shows a fifth embodiment of an X or Y axis magnetic field sensor.
Figure 6B:
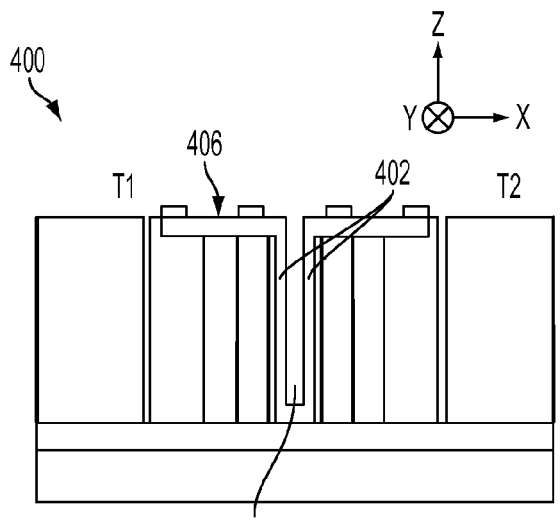
Figure 6C:
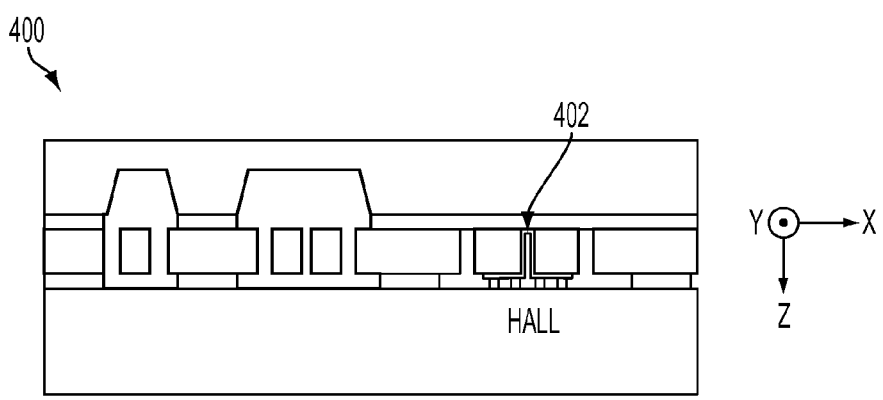

A fifth embodiment of an X or Y axis magnetic field sensor 400 is shown in FIG. 6A-6C. The structure and manufacture process is similar to previous embodiments, except for the implementation of a high mobility material 406 deposited on the device layer, orientation of the Hall plate 402 and the arrangement of the sensing terminals.

T1 404(a) and T2 404(b) are the source terminals connected to electrical ground and electrical supply such as voltage source or current source, respectively. Near the edge of the isolation trench 403, the current first flows in the negative Z-direction toward the bottom of the device layer, then bends toward the positive Z-direction. The remaining two terminals T3 404(c) and T4 404(d) are the sensing terminals. The Hall plate 402 is orientated in YZ plane with current flowing in Z direction. Upon applying a magnetic field in X-direction, a Hall voltage between T3 404(c) and T4 404(d) is generated, is a function of the magnetic field, and is sensed by the sensing circuitry. The side-view of a device structure with potential integration with other sensors in the process platform is illustrated in FIG. 6C.

A slope sidewall Hall sensor constructs a Hall plate on the slopes of a cavity created by micromachining methods. Because the 3-axis sensors are formed simultaneously and the distances between Hall sensors are in the range of ten microns compared with hundred microns for sensors with IMC solution, the sensitivity mismatch between axes of the invented solution is superiorly lower than existing technologies. In addition, because the angles of the slopes are defined by the crystal structure of the silicon substrate, the non-orthogonality between axes is minimized. These two features result in a device with smaller azimuth error.

Figure 7A:
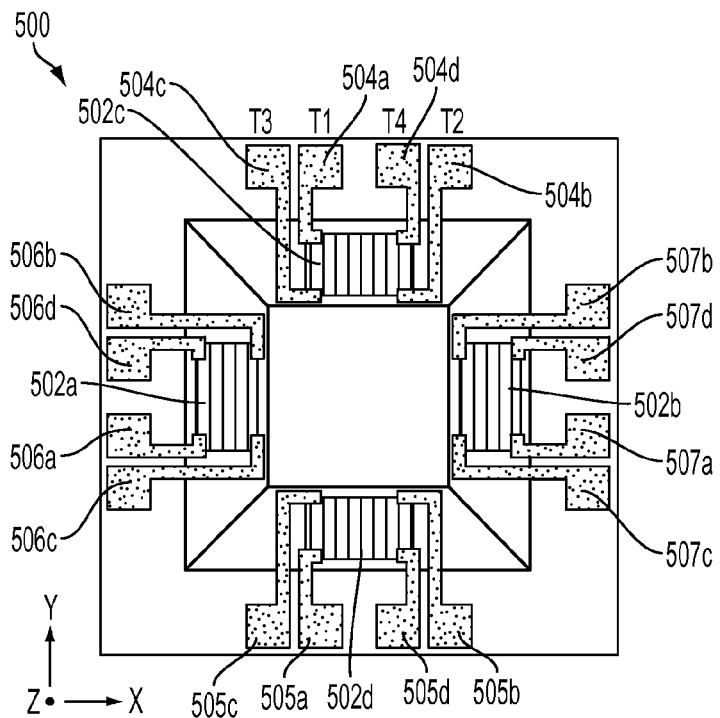
FIGS. 7A and 7B shows a sixth embodiment of an 3-axis magnetic field sensor.
Figure 7B:
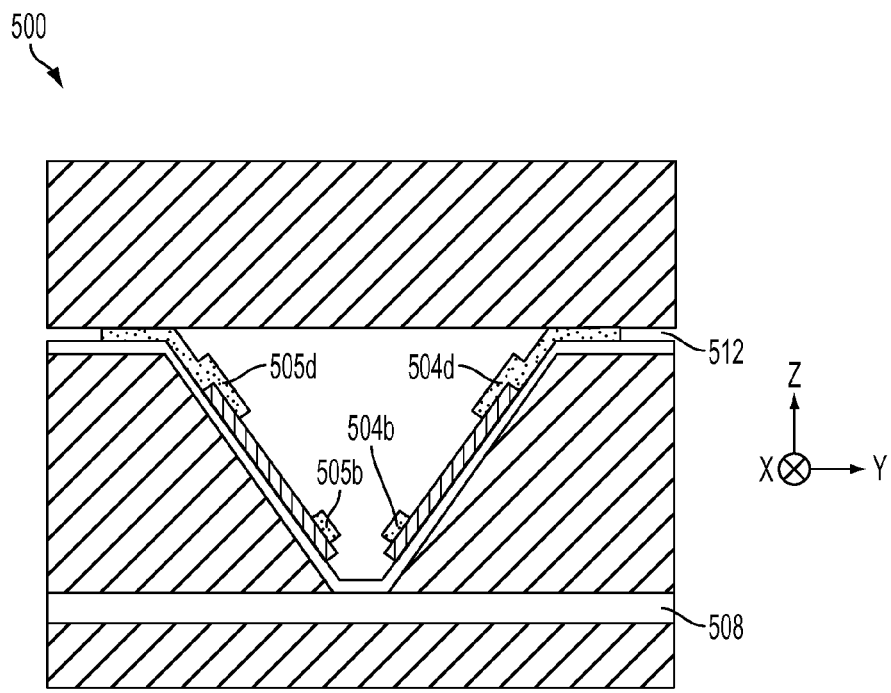

A sixth embodiment of an X axis or Y axis magnetic field sensor 500 is shown in FIG. 7A-7B. From the top-down angle of FIG. 7A, four magnetic sensors 502(a)-502(d) are constructed on the slope sidewalls. The slope is formed by micromachining methods such as wet etching or dry etching. The structure and manufacturing process is similar to previous embodiments, except for the process of forming a trench, and the orientation of the Hall plates 502(a)-502(d) is on a slope. In an embodiment, the slope of the Hall plate 502(a)-502(d) is about 54.74 degrees. After depositing a layer of electrical isolation material 508, a high mobility layer is deposited and patterned.

An additional electrical wiring layer 512 is applied to connect the terminals of the Hall plate 502 to the top surface of the device layer. In an embodiment with Hall sensing elements as the magnetic sensors, the vertical axis of the slope is the sensing direction. The sensing signals of the first pair of the magnetic sensor correspond to the magnetic field components in both X and Z direction and the signals of the second pair are related to both Y and Z magnetic field components.

Thus, the vector of the 3-axis magnetic field can be extracted from the readings of these two pairs of the magnetic sensor. The fabrication process is based on Nasiri fabrication platform with minimum modifications including (1) etching to form the slopes, (2) depositing the electrical isolation material, electrical wiring layers and a magnetic sensor layer, and (3) patterning these additional layers. In addition, a protection substrate can be bonded to the device and the cross-section of the magnetic sensing device is shown in FIG. 7B.

The Hall plate 502 is orientated on the slope of about 54.74 degrees to the surface of the device layer. The supplied current flows in parallel to the surface of the slope. The Hall voltages of Hall plate 502a and 502b are the functions of the magnetic field in both X and Z direction. Since the X-direction magnetic field generates differential Hall voltage outputs and the Z-direction magnetic field generates common mode Hall voltage outputs, the Hall voltages difference of the Hall plate 502a and 502b indicates the magnetic field intensity in X direction. The Hall voltages difference of the Hall plate 502c and 502d indicates the magnetic field intensity in Y direction. The sum of the Hall voltages of the four Hall plates 502a-d indicates the magnetic field intensity in Z direction. For a Hall plate, there are at least four terminals; two source terminals connected to electrical ground and electrical supply such as voltage source or current source; and two sensing terminals connected to the sensing circuitry. These terminals are illustrated in the FIG. 7 where the terminals 506a-d, 507a-d, 504a-d and 505a-d are for the Hall plate 502a, 502b, 502c, and 502d, respectively.

Figure 8A:
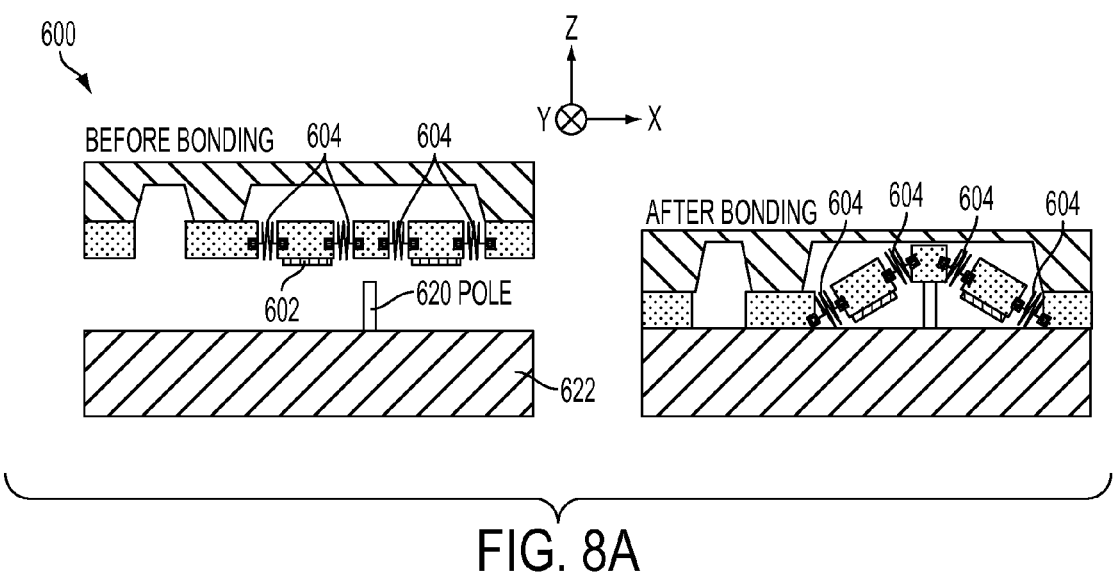
FIG. 8A is a seventh embodiment of a 3-axis magnetic field sensor; (a) before wafer level bonding, (b) after bonding.

A seventh embodiment of a 3-axis magnetic field sensor 600 is show in FIG. 8A. The operation principle is the same as the previous embodiments 500 shown in FIGS. 7A and 7B, but the fabrication process is different. The seventh embodiment 600 comprises a pole 620 fabricated on the base layer 622 and magnetic field sensors attached to the device layer by compliant structures 604, as shown in FIG. 8A. Through wafer-level bonding process, the magnetic field sensors 602 are placed with a slope respecting to the x-y surface. The slope is defined by the geometry of the magnetic field sensor and the height of the pole 620. The height of pole is a function of the size of magnetic sensor and the desired slope angle and is in the range of 20-100 microns. The embodiment is advantageous by eliminating the fabrication complexity associated with the steps of lithography and etching on the slope shown in the sixth embodiment 500 of FIGS. 7A and 7B.

Figure 8B:
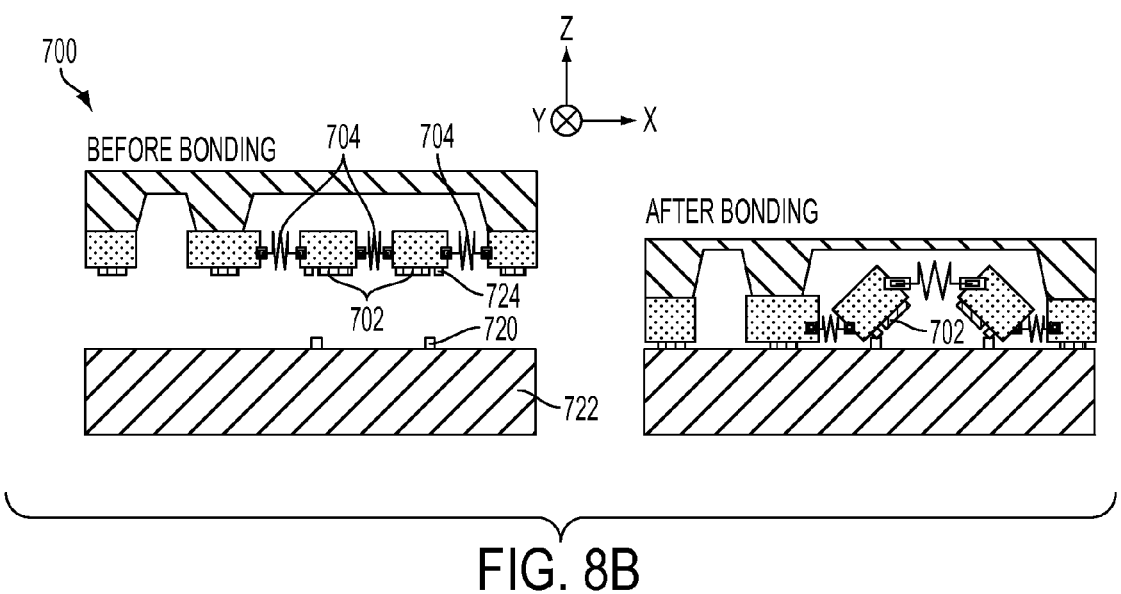
FIG. 8B is the eighth embodiment of a 3-axis magnetic field sensor; (a) before wafer level bonding, (b) after bonding.

An eighth embodiment of 3-axis magnetic field sensor 700 is shown in FIG. 8B. The operation principle is the same as the previous embodiments 600 shown in FIG. 8A, but a bump 724 is formed on the device layer and a pole 720 is formed on the base layer 722. The height of bump 724 and pole 720 in this embodiment are about 1-2 microns. After wafer-level bonding process, the magnetic field sensors are pushed upward by the pole and placed with a slope respecting to the X-Y surface. To create large slope angle, a lever design is needed to amplify the limited vertical displacement because of the 1-2 um of pole height. The embodiment is advantageous because of not only eliminating the fabrication complexity associated with the steps of lithography and etching on the slope shown in the sixth embodiment, but also lowering the requirement of the pole height for achieving the same slope angle comparing with the seventh embodiment.

Figure 9A:
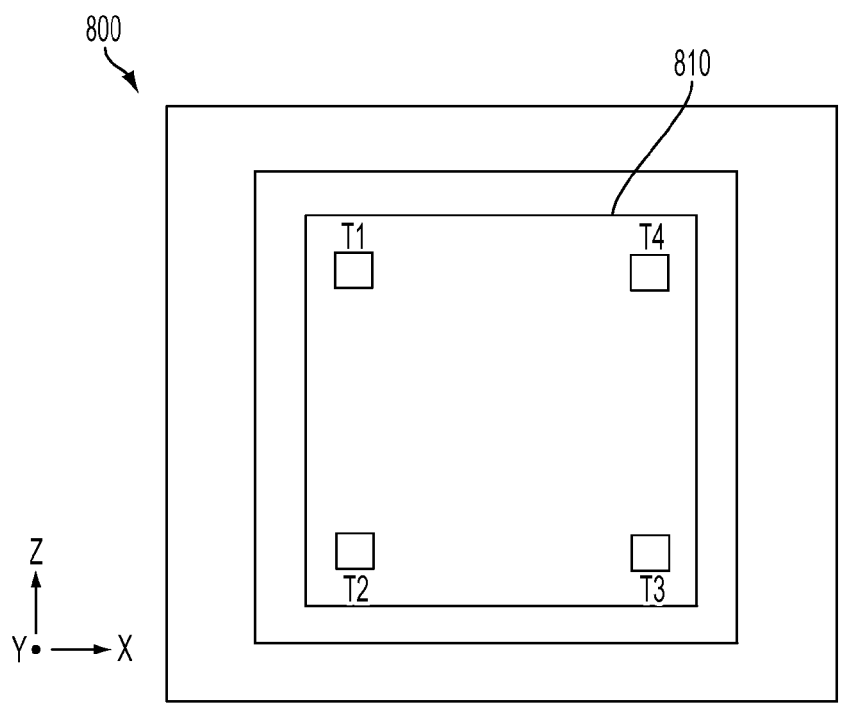
FIGS. 9A and 9B illustrates a Z-axis Hall-effect magnetic field sensor fabricated on the device layer.
Figure 9B:
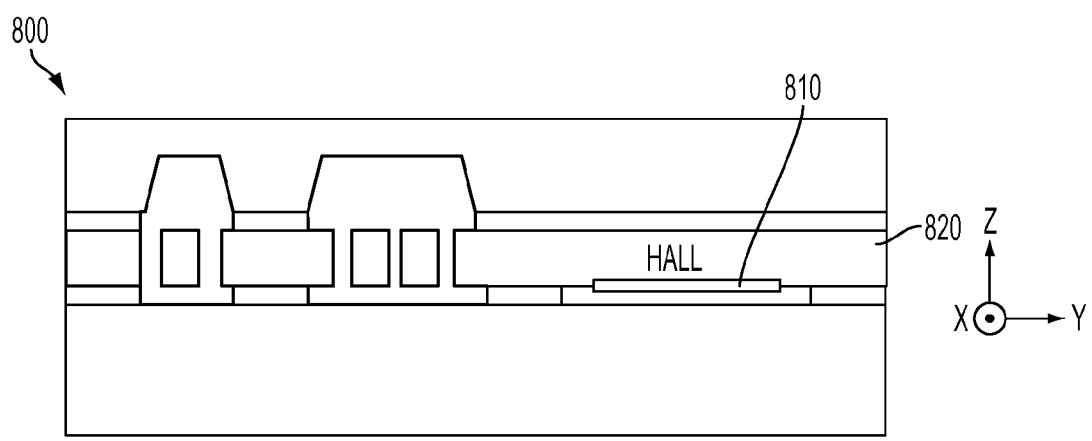

In addition, an alternative of the embodiment of a Z-axis Hall plate is to establish the Hall plate 810 in the device layer with ion-implantation or doping. The construction of the alternative is similar to the process of Z-axis Hall plate described in FIG. 1. By implementing a high mobility layer 810 as shown in FIGS. 9A and 9B, the Z-axis magnetic sensor 800 can be established on the surface of the device layer 820. The top-down and possible integration with other sensors are the illustrated in FIGS. 9A and 9B. The operation mechanism is the same as the Z-axis magnetic field sensor described in FIG. 1.

Figure 10A:
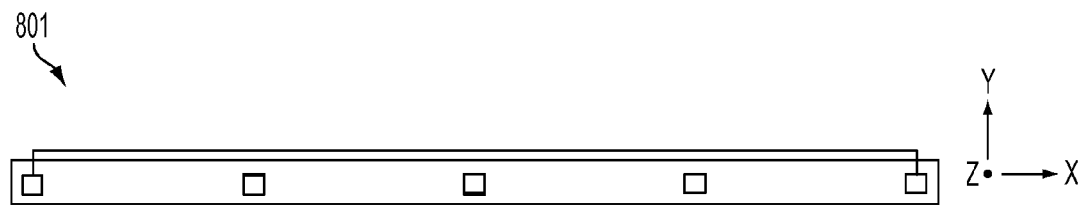
FIGS. 10A-10C show a ninth embodiment of a magnetic field sensor to sense magnetic field in X or Y direction.
Figure 10B:
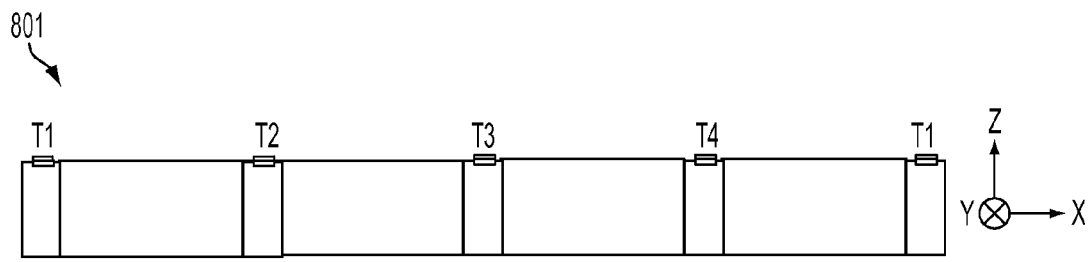
Figure 10C:
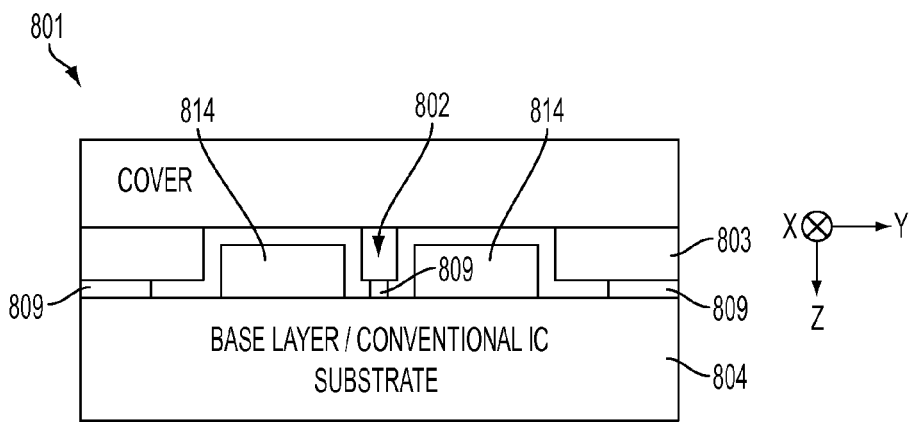

A ninth embodiment of a magnetic field sensor 801 to sense magnetic field in X or Y direction 801 is shown in FIGS. 10A-10C. The technology provides a low cost solution to enhance the sensitivity.

Each Hall plate 802 of the magnetic field sensors are formed on the device layer which is attached to the IC substrate via bonding agents 809. The Hall plate 802 of the magnetic field sensor is as narrow as few microns in Y direction and as deep as the thickness of the device layer 803 in Z direction. The plate 802 is fabricated on a low doped single crystal device layer 803 and patterned by DRIE process with the process similar to the embodiment of the FIGS. 2A-2C.

Magnetic flux concentrators 814 are constructed on the IC substrate 804. The magnetic flux concentrators 814 sandwich a Hall plate 802 to condense the magnetic flux for high sensitivity. To enlarge the magnetic flux condensing, the distance between the movable flux concentrators 814 and the Hall plate 802 is as narrow as few microns in Y direction. The side-view of a device structure with potential integration with other sensors in the process platform is illustrated in FIG. 10C.

Stress Isolation Structure

The Hall effect sensor fabricated by means of CMOS technology is preferred due to its low-cost batch fabrication with CMOS technology. However, a CMOS Hall sensor features mediocre performance and its weak output signals are often corrupted by sensor offset which is about 1000× larger than the signal generated from the earth magnetic field. The offset is resulted from fabrication gradients of the magnetic sensor doping, misalignment of fabrication process, and mechanical stress through the piezoelectric effect.

The present invention addresses the need of reducing sensor offset by lowering the mechanical stress with stress isolation structures. A plate with lower mechanical stress results in smaller sensor offset which is a major limitation in the resolution of electronic compassed for detecting the weak earth magnetic field.

Figure 11A:
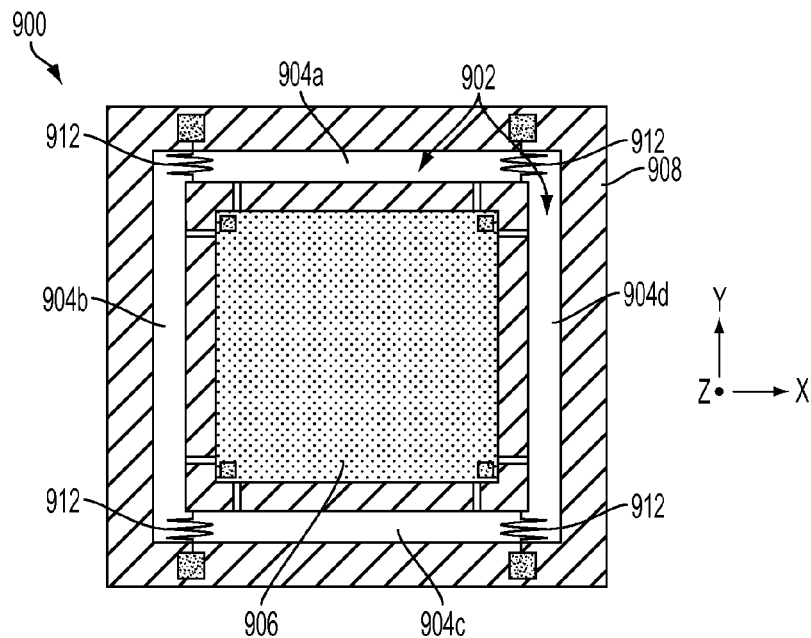
FIGS. 11A-11C illustrates a design of a first embodiment of the stress isolation structure.
Figure 11B:
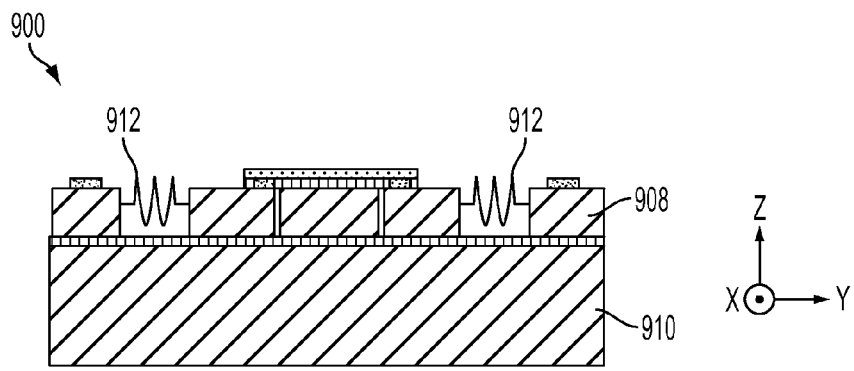
Figure 11C:
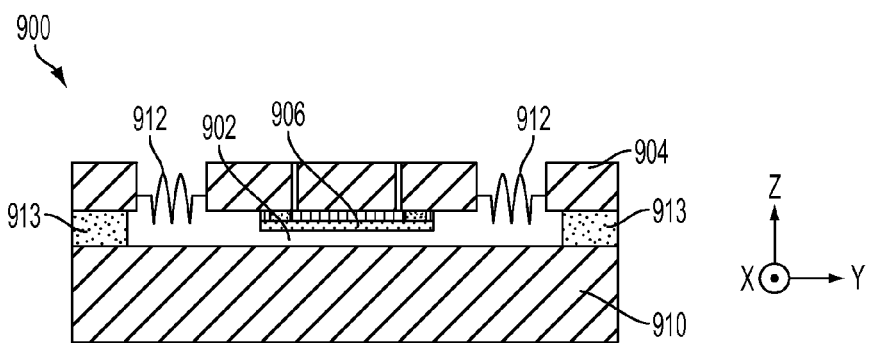

The design of the first embodiment of the stress isolation structure 902 is illustrated in the FIGS. 11A-11C. The structure 902 comprises separations 904a-904d formed by semiconductor process means and surrounds the magnetic sensor 900. The separations 904(a)-904(c) decouple the magnetic sensors 906 from the stress in the device layer 908 in X and Y direction illustrated in FIG. 11B. In addition, the stress isolation structure 902 in Z direction could be formed in a similar method by having stress isolation structure 902 between the magnetic sensors 906 on layer 904 and the bulk layer 910, illustrated in FIG. 11C. In addition to horizontal stress isolation, the stress isolation structure 902 is formed vertically through bonding the magnetic sensors 900 to the bulk layer 910 with bonding agents 913 where the thickness of the bonding agents 913 defines the vertical separation of the trench. The device 900 further comprises compliant structures 912 across the separations 904(a)-904(d) formed by semiconductor process to provide electrical connection or mechanical support.

Figure 12A:
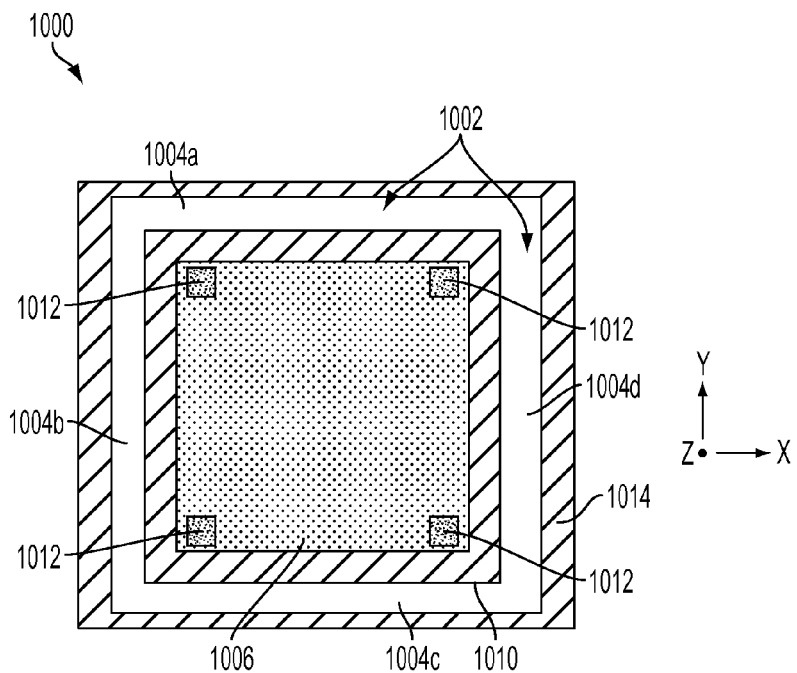
FIGS. 12A-12C illustrates a design of a second embodiment of the stress isolation structure.
Figure 12B:
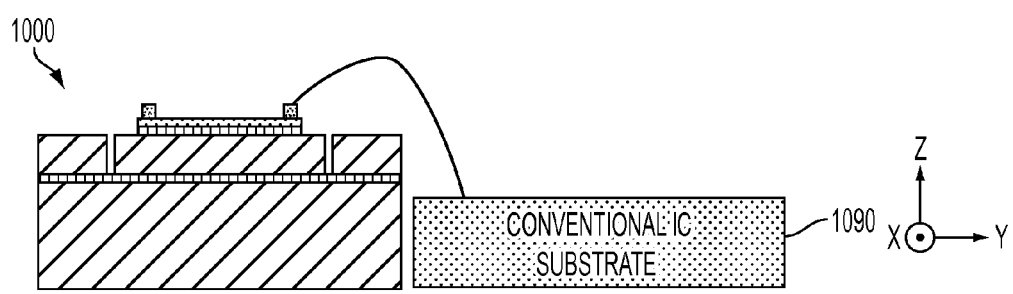
Figure 12C:
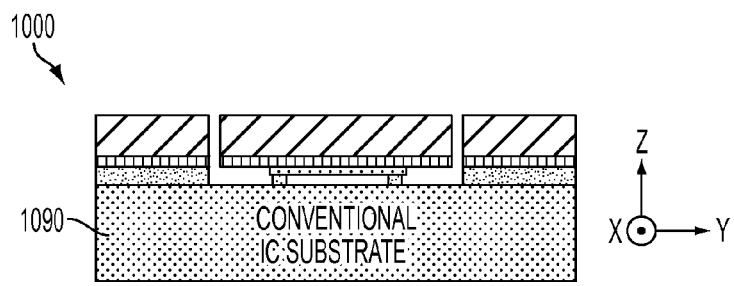

The design of the second embodiment of the stress isolation structure 1002 is illustrated in the FIGS. 12A-12C. The separations 1004(a)-1004(d) of the stress isolation structure 1002 reduce the stress coupling from the device layer 1014 into the magnetic sensor 1006. The bonding agents 1012 provide electrical connections between magnetic sensors 1006 and the conventional IC substrate 1000. FIGS. 12B and 12C illustrate two different embodiments of the bonding agents with wirebonding and interconnect layers for wafer level bonding, respectively.

Figure 13:
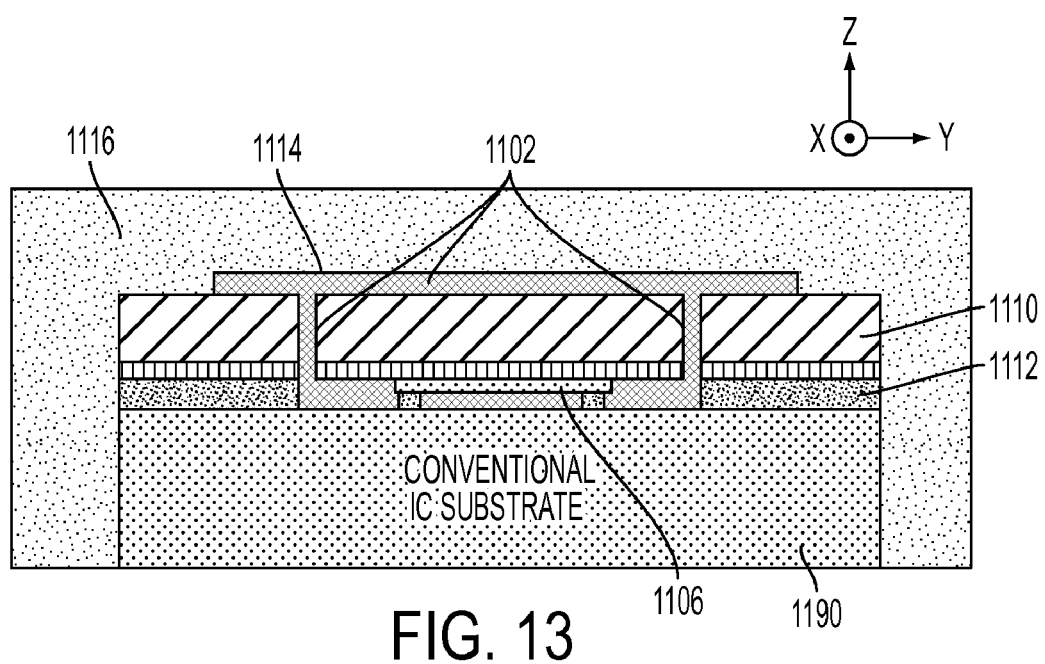
FIG. 13 illustrates a design of a third embodiment of the stress isolation structure with buffer material.

For devices requiring low topography surface or with stress induced from the encapsulation layer of magnetic sensors, a buffer material can be deposited in the trench or between the sensor and the encapsulation layer. Illustrated in FIG. 13, the magnetic sensor 1106 is surrounded by the stress isolation structures. A buffer material 1114 is deposited on the top surface of the magnetic sensor 1106 and in the stress isolation structure 1102. Then, the magnetic sensor 1106 is protected by an encapsulation material 1116. The stress coupling which is induced by the encapsulation material on the magnetic sensor is reduced horizontally and vertically by the stress isolation layer 1102 and the buffer material 1114. This results in lower stress level in the magnetic sensor and generates lower sensor offset. In general, the buffer material 1114 is of low Young's modulus material, such as benzocyclobutene (BCB), SUB, Polyimide, Polybenzoxazaole (PBO), and other polymers. In plastic package such as QFN (Quad Flat No leads), the encapsulation material 1116 is molding compounds or epoxy resins.

Figure 14:
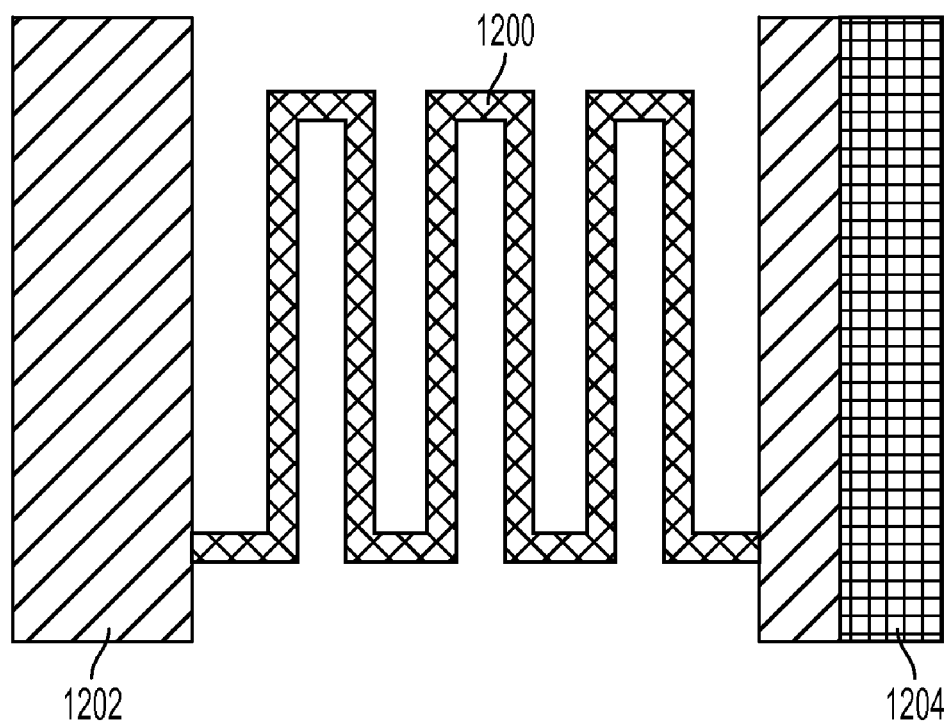
FIG. 14 illustrates a design of a compliant structure.

An example of the compliant structure shown in FIGS. 11A-11C is illustrated in FIG. 14. The compliant structure 1200 comprises multiple flexible beams connected in series to lower the mechanical stiffness. The compliant structure 1200 can provide electrical connections or mechanical supports between the bulk layer 1202 and the magnetic sensor 1204.

In a system and method in accordance with the present invention, the minimum detectable signal can be reduced by a two phase measurement (detecting and then subtracting) to further reduce the residual magnetization, initial Hall plate offset, and misalignment of the movable flux concentrator.

These effects are the main limiting issues for lowering offset and the minimum detectable signal.

A system and method in accordance with the present invention can be applied to form a 3-axis magnetic sensor for electronics compass application. The in-planee magnetic sensors are constructed in the device layer and the out-of-plane magnetic sensors are formed either on the device layer or on the IC substrate.

To obtain a smart sensor with multiple sensing functions, the present invention can be integrated with several sensors such as accelerometers, gyroscopes, pressure sensors, and the like.

The structure of a magnetic field sensor in this invention is designed into four different types, shown in FIGS. 15A-15D: (a) a device layer 1402 bonded in to a base layer 1403 comprising IC circuitry; (b) a device layer 1402 protected by a cover substrate 1405 and bonded to a base layer 1403 comprising IC circuitry; (c) a device layer 1402 bonded to a base layer 1403 and electrically connected to a conventional IC substrate 1407 with means such as wire bonding; and (d) a device layer 1402 protected by a cover substrate 1405 and electrically connected to a conventional IC substrate 1407 with means such as wire bonding.

A system and method in accordance with this present invention relates to the magnetic field sensors that are fabricated using silicon micromachining methods that have been described in U.S. Pat. No. 6,892,575 and U.S. Pat. No. 7,104,129 previously. In this approach the sensing structures of the magnetic field sensors are defined on a device layer. The device layer are attached to the cover substrate by means of diffusion bonding and attached to the conventional IC substrate by means of eutectic bonding.

A system and method in accordance with this invention discloses a low cost, micromachined magnetic field sensor integrated with electronics. The proposed magnetic field sensors apply Hall-effect sensing mechanisms to achieve 3-axis sensing. In some embodiments, a flux concentrator is applied to enhance the performance of the magnetic field sensor. A conventional IC substrate and device layer is connected electrically to form a 3-axis magnetic sensing system. The magnetic field sensor can also be integrated with motion sensors that are constructed in the same technology.

ADVANTAGES

1. Better integration between transducers and signal processing IC with wafer-level bonding.
2. Smaller footprint by having 3-dimensional transducer system.
3. Higher sensitivity by the integration of magnetic concentrators or high mobility layers.
4. Lower offset and temperature coefficient of offset because of large thickness and stress isolation design.

Although the present invention has been described in accordance with the embodiments shown, one of ordinary skill in the art will readily recognize that there could be variations to the embodiments and those variations would be within the spirit and scope of the present invention. For example, although the magnetic sensors and sensing elements have been described as Hall sensors, the sensing elements could be any of a Lorentz effect magnetic sensor; a magnetoresistive sensor; a magneto-diode sensor; a magneto-transistor; a fluxgate; a magneto-impedance sensor; a magneto-optical sensor; and MAGFET or the like and their use would be within the spirit and scope of the present invention. Accordingly, many modifications may be made by one of ordinary skill in the art without departing from the spirit and scope of the appended claims.

What is claimed is:

1. A micromachined magnetic field sensor comprises:
   at least two magnetic field sensing elements formed only on sloped sidewalls, such that outputs of the at least two magnetic field sensing elements are combined to detect in-plane magnetic fields and out of plane magnetic fields; and
   at least one electrical wiring layer connecting at least one of the at least two magnetic field sensing elements to a source or a sensing terminal,
   wherein the sloped sidewalls are formed by displacing the at least two magnetic field sensing elements vertically with at least one pole.

2. The sensor of claim 1, further comprising a cover layer with at least one cavity, wherein a portion of the sloped sidewalls reside in the at least one cavity.

3. The sensor of claim 2, wherein the at least one cavity is formed by micromachining reactive ion etching.

4. The sensor of claim 2, wherein the at least one cavity is formed by micromachining wet etching.

5. The sensor of claim 1, wherein at least one CMOS circuitry is formed on a base layer.

6. The sensor of claim 1, wherein the at least one magnetic field sensing element comprises III-V compound material.

7. The sensor of claim 5, where the at least two magnetic field sensing terminals are connected to the base layer via bonding agents.

8. The sensor of claim 7 wherein the bonding agents are wirebonds and metal bonding pads.

9. The sensor of claim 7 wherein the bonding agents are interconnect layers for wafer level bonding.

10. The sensor of claim 9 wherein bonding agents are patterned thin films of germanium layer, which is bonded to the at least one patterned aluminum layer on the base layer.

11. The sensor of claim 1 wherein the at least two magnetic field sensing elements are Hall effect magnetic sensors.

12. The sensor of claim 11, wherein the at least one magnetic field sensing element comprises N type doped silicon material.

13. The sensor of claim 11, wherein the at least one magnetic field sensing element comprises P type doped silicon material.

14. The sensor of claim 1 wherein the at least two magnetic field sensing elements are any of a Lorentz effect magnetic sensor; a magnetoresistive sensor; a magneto-diode sensor; a magneto-transistor; a fluxgate; a magneto-impedance sensor; a magneto-optical sensor; and MAGFET.

15. The sensor of claim 1, further comprising at least one bump, the at least one bump rests on the at least one pole to form the sloped sidewalls.

\* \* \* \* \*